(12) United States Patent
Huang

(10) Patent No.: US 6,452,270 B1
(45) Date of Patent: Sep. 17, 2002

(54) SEMICONDUCTOR DEVICE HAVING BUMP ELECTRODE

(75) Inventor: Min-Lung Huang, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 09/764,313

(22) Filed: Jan. 19, 2001

(51) Int. Cl.$^7$ .......... H01L 23/48; H01L 23/52; H01L 29/40
(52) U.S. Cl. .......... 257/738; 257/779; 257/783; 257/737; 257/761; 257/762; 257/767
(58) Field of Search .......... 257/738, 779, 257/783, 737, 761, 762, 767, 772, 773, 780, 781; 438/613

(56) References Cited

U.S. PATENT DOCUMENTS

| | | | | |
|---|---|---|---|---|
| 4,514,751 A | * | 4/1985 | Bhattacharya | 357/71 |
| 5,631,499 A | * | 5/1997 | Hosomi et al. | 257/737 |
| 5,903,058 A | * | 5/1999 | Akram | 257/778 |
| 5,925,931 A | * | 7/1999 | Yamamoto | 257/737 |
| 6,075,290 A | | 6/2000 | Schaefer et al. | |
| 6,111,317 A | * | 8/2000 | Okada et al. | 257/737 |
| 6,111,321 A | * | 8/2000 | Agarwala | 257/772 |
| 6,287,893 B1 | * | 9/2001 | Elenius et al. | 438/108 |

* cited by examiner

Primary Examiner—Eddie Lee
Assistant Examiner—Joseph Nguyen
(74) Attorney, Agent, or Firm—Dykema Gossett PLLC

(57) ABSTRACT

A semiconductor device having bump electrodes mainly comprises a specialized under bump metallurgy (UBM) applied to a chip with copper contact pads. Typically, the chip comprises a substrate and at least one copper contact pad on the substrate. A passivation layer is formed over the substrate and has an opening positioned over the al least one copper contact pad. The UBM includes a titanium layer, a first copper layer, a nickel-vanadium layer and a second copper layer. The titanium layer forms a closed-loop surrounding the opening of the dielectric layer. The first copper layer is formed over the titanium layer and the opening of the dielectric layer such that the first copper layer directly contacts the copper contact pad. The nickel-vanadium layer is formed on the first copper layer and the second copper layer is formed on the nickel-vanadium layer. A metal bump is provided on the UBM over the copper contact pad thereby forming a bump electrode. The UBM of the present invention is characterized by using the titanium layer with a closed-loop shape as the adhesion layer to significantly increase the adhesion between the UBM and the passivation layer, and using the first copper layer, which is directly contacted with the copper contact pad, to provide a better electrical performance.

9 Claims, 4 Drawing Sheets

SEMICONDUCTOR DEVICE HAVING BUMP ELECTRODE

BACKGROUND OF THE INVENTION

1. Field of the Invention

This invention relates to electronic assembly technology and more specifically to solder bump interconnections for mounting chips with copper I/O pads to an interconnection substrate.

2. Description of the Related Art

As chips continue to decrease in size, pure copper circuits have been found to have undeniable advantages that traditional aluminum interconnects cannot match. Copper wires conduct electricity with about 40 percent less resistance than aluminum. That translates into a speedup of as much as 15 percent in microprocessors that contain copper wires. Furthermore, copper wires are also far less vulnerable than those made of aluminum to electromigration, the movement of individual atoms through a wire, caused by high electric currents, which creates voids and ultimately breaks the wires. Most important, the widths of copper wires can be squeezed down to the 0.2-micron range from the current 0.35-micron widths—a reduction far more difficult for aluminum. Conventional aluminum alloys cannot conduct electricity well enough, or withstand the higher current densities needed to make these circuits switch faster when wires with very small dimensions is used. Gradually chips with copper interconnects will substitute for chips with traditional aluminum interconnects.

Moreover, as electronic devices have become smaller and thinner, the velocity and the complexity of IC chips has increased. Accordingly, a need has arisen for higher package efficiency. Demand for miniaturization is the primary catalyst driving the u sage of advanced pack ages such as chip scale packages (CSP) and flip chips. Both greatly reduce the amount of board real estate required when compared to the alternative ball grid array (BGA) and quad flat pack (QFP). Typically, a CSP is 20 percent larger than the die itself, while the flip chip has been described as the ultimate package precisely because it has no package. The bare die itself is attached to the substrate by means of solder bumps directly attache to the die.

Flip-chip bumping technology typically comprises (a) forming an under bump metallurgy (UBM) on bonding pads of the chip, and (b) forming metal bumps on the UBM. Typically, UBM consists of three metal layers, including: (a) adhesion layer (formed of Al or Cr) for purposes of providing a good adhesion to Al pad and passivation layer; (b) barrier layer (formed of NiV or TiW) for preventing contact pads on the chip and the bump electrode from reacting with each other to generate an intermetallic compound (which is harmful to the reliability of chip); and (c) wetting layer (formed of Ni, Cu, Mo or Pt) wherein that kind of metals provide a higher wetting power to solder thereby allowing for proper wetting of solder during solder-reflow process. Typically, the metal bump is made of conductive material (such as metal high melting point solder alloys, low melting point solder alloys, gold, nickel or copper), depending on the characteristics needed in the to-be-formed flip-chip.

FIG. 1 is a cross sectional view of a conventional semiconductor having a bump electrode. An aluminum contact pad 110 is formed on a substrate 120 of a semiconductor integrated circuit. A passivation film 130, serving as an insulation film, is formed on the entire surface of the substrate 120. A passivation opening section which is formed at a predetermined position, is formed to expose the aluminum contact pad 110. The semiconductor device 100 has a UBM 140 consisting of three metal layers, including: (a) aluminum layer 140a used as the adhesion layer; (b) nickel-vanadium layer 140b used as the barrier layer; and (c) copper layer 140c used as the wetting layer.

However, the UBM 140 is not applicable to chips with copper contact pads because of poor aluminum-to-copper adhesion. Therefore, the semiconductor industry has developed a semiconductor device 200 (see FIG. 2) wherein the UBM 240 consists of two metal layers, including: (a) titanium layer 240a used as the adhesion layer and the barrier layer; and (b) copper layer 240b used as the wetting layer. Although the titanium layer has a good adhesion to both of the passivation layer 130 and the copper contact pad 210, it has a disadvantage of poor electric conductivity as compared to a copper layer.

The present invention therefore seeks to provide an under bump metallurgy which overcomes, or at least reduces the above-mentioned problems of the prior art.

SUMMARY OF THE INVENTION

It is a primary object of the present invention to provide an under bump metallurgy (UBM) adapted for chip with copper contact pads wherein the UBM is capable of providing a better electrical performance.

It is another object of the present invention, by integrating the UBM of the present invention with I/O distribution, to provide a semiconductor device having a structure that permits rearrangement of contact pads and provides a better electrical performance.

The UBM of the present invention is applied to a chip with copper contact pads in order to form a semiconductor device having bump electrodes. Typically, the chip comprises a substrate and at least one copper contact pad on the substrate. A passivation layer is formed over the substrate and has an opening positioned over the al least one copper contact pad. The UBM includes a titanium layer, a first copper layer, a nickel-vanadium layer and a second copper layer. The titanium layer forms a closed-loop surrounding the opening of the dielectric layer. The first copper layer is formed over the titanium layer and the opening of the dielectric layer such that the first copper layer directly contacts the copper contact pad. The nickel-vanadium layer is formed on the first copper layer and the second copper layer is formed on the nickel-vanadium layer. A metal bump is provided on the UBM over the copper contact pad thereby forming a bump electrode. Consequently, the semiconductor device of the present invention can be directly mounted to a interconnection substrate by means of bump electrodes directly attached thereon.

The UBM of the present invention is characterized by using the titanium layer with a closed-loop shape as the adhesion layer to significantly increase the adhesion between the UBM and the passivation layer, and using the first copper layer, which is directly contacted with the copper contact pad, to provide a better electrical performance.

The present invention further provides a semiconductor device having a structure that permits rearrangement of contact pads. The semiconductor device comprises a substrate having a copper contact pad formed thereon; a first dielectric layer formed over the substrate, the first dielectric layer having a first opening positioned over the copper contact pad; a multi-layered lead having a first end portion connected to the copper contact pad through the first opening and a second end portion extending on the first dielectric layer; a second dielectric layer formed over the multi-layered lead and the first dielectric layer, the second dielectric layer having a blind-via formed corresponding to the second end portion of the multi-layered lead; a conductive pad formed over the blind-via; and a metal bump provided on the conductive pad. The multi-layered lead includes a first titanium layer on the first dielectric layer, a copper layer on the first titanium layer and a second titanium layer on the copper layer wherein the first titanium layer has a second opening corresponding to the first opening and the copper layer directly contacts the copper contact pad through the second opening and the first opening.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 7:
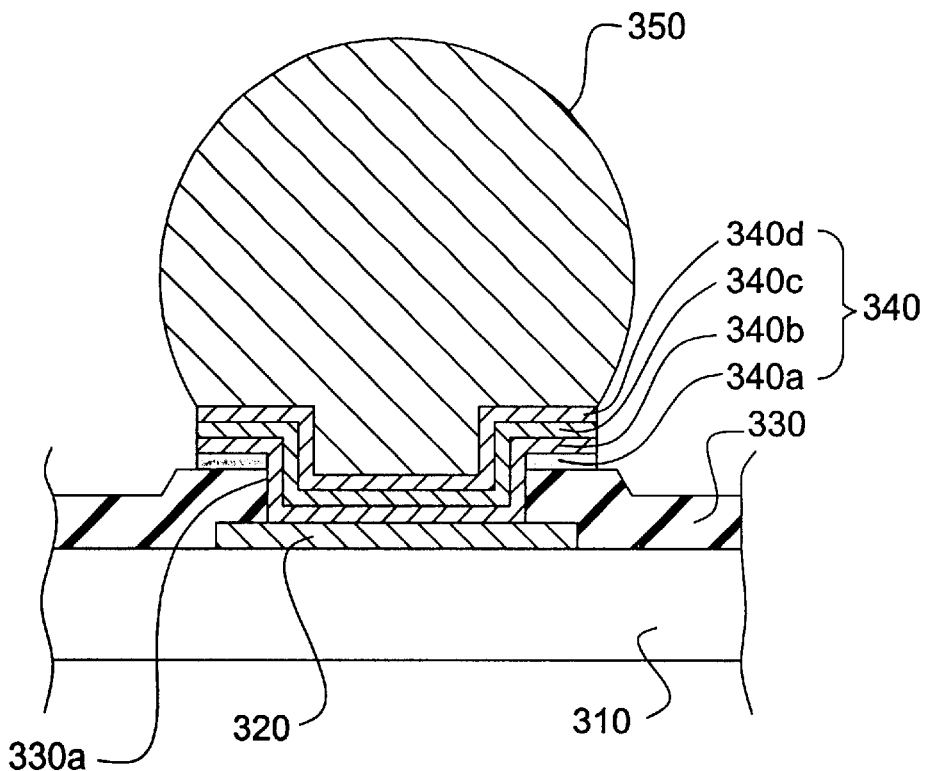
FIG. 7 is a schematic sectional view of a portion of a semiconductor device having a bump electrode in accordance with a preferred embodiment of the present invention.

As shown in FIG. 7, a semiconductor device include a substrate 310, a copper contact pad 320, and a dielectric layer such as passivation layer 330. The substrate 310 may comprise a layer of a semiconducting material such as silicon, gallium arsenide, silicon carbide, diamond, or other substrate materials known to those having skill in the art. The passivation layer 330 is preferably a polyimide layer but can alternately be a silicon dioxide layer, a silicon nitride layer, or layers of other passivation materials known to those having skill in the art. As shown, the passivation layer 330 preferably covers the top edge portion of the copper contact pad 320 opposite the substrate, leaving the central surface portion of the copper contact pad 320 exposed from the passivation layer 330. The UBM 340 in accordance with the present invention includes a titanium layer 340a, a first copper layer 340b, a nickel-vanadium layer 340c and a second copper layer 340d. The titanium layer 340a is provided on the passivation layer 330 to form a closed-loop surrounding the opening 330a of the dielectric layer 330. The first copper layer 340b is formed over the titanium layer 340a and the opening 330a of the dielectric layer 330 such that the first copper layer 340b directly contacts the copper contact pad 320. The nickel-vanadium layer 340c is formed on the first copper layer 340b and the second copper layer 340d is formed on the nickel-vanadium layer 340c.

The UBM 340 of the present invention chooses the titanium layer 340a as adhesion layer, due to good adhesion of titanium to the passivation layer 330, to obtain a better adhesion between the first copper layer 340b and the passivation layer 330. Since the titanium layer 340a is formed as a closed-loop surrounding the opening 330a of the dielectric layer 330, the first cooper layer 340a is allowed to directly contacts the copper pad thereby providing a better electrical performance. Furthermore, the UBM 340 utilizing the nickel-vanadium layer 340b as the barrier layer and utilizing the second copper layer 340d as the wetting layer.

The semiconductor device shown in FIG. 7 further comprises a solder bump 350 provided on the UBM 340 over the copper contact pad 320 to act as a bump electrode. Consequently, the semiconductor device of the present invention can be directly mounted to a interconnection substrate by means of the bump electrodes directly attached thereon. Typically, there are two kinds of solder compositions used to form the solder bump 350. They includes (a) high melting point solder alloys such as 5Sn/95Pb or 3Sn/97Pb and (b) lower melting point solder alloys such as 63Sn/37Pb or 40Sn/60Pb. Bumping process is typically accomplished by vapor deposition, electroplating or printing. Alternatively, the solder bump 350 may be replaced with a gold bump. Typically, the gold bump comprises at least about 90 weight percentage of Au deposited on the UBM 340 by means including electroplating or evaporative lift-off.

A subtractive process may be used to form the UBM 340 in accordance with the present invention.

Figure 1:
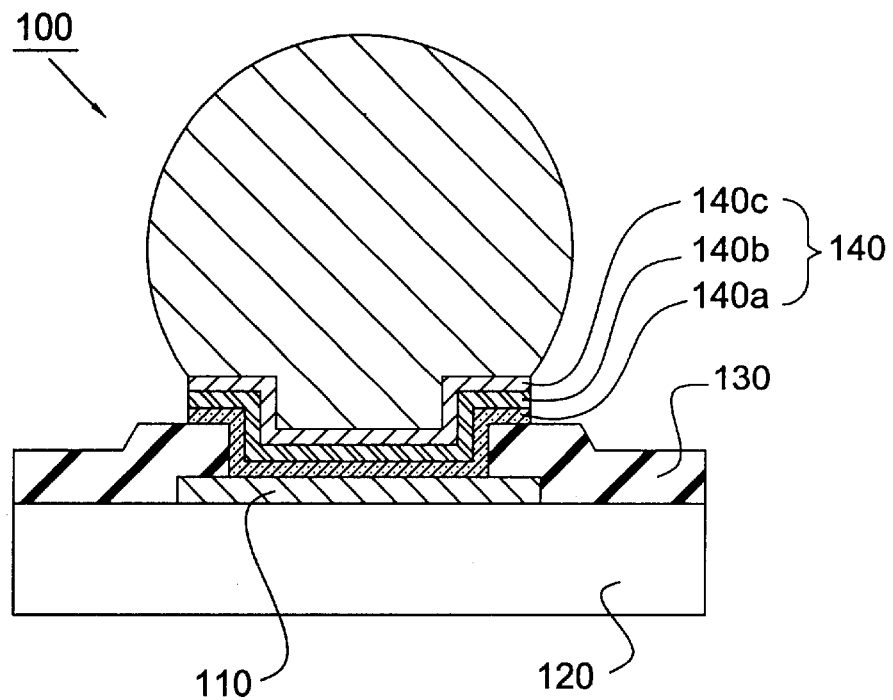
FIG. 1 is a schematic sectional view of a conventional semiconductor device having a bump electrode.
Figure 2:
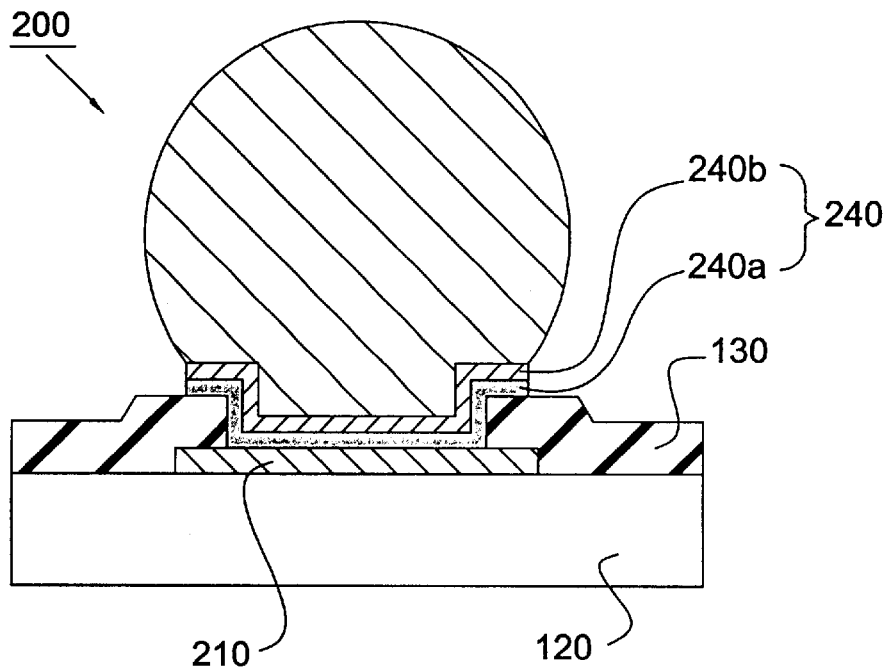
FIG. 2 is a schematic sectional view of another conventional semiconductor device having a bump electrode.
Figure 3:
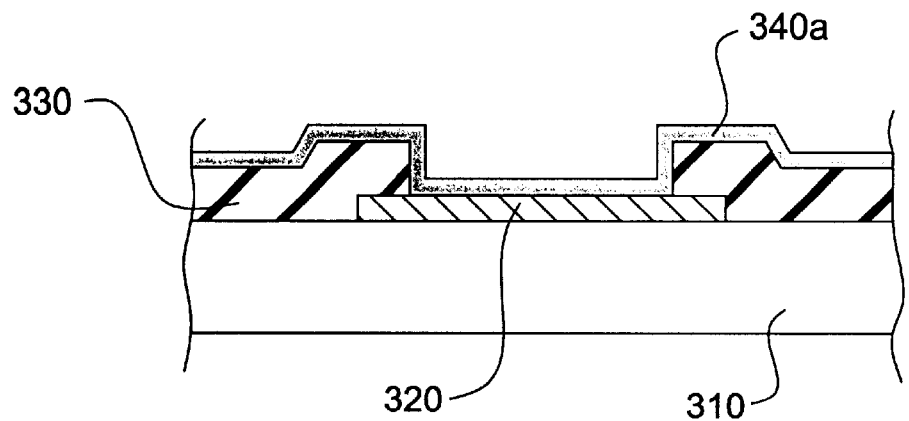
FIGS. 3–6 illustrate in cross-section major steps of formation of the UBM in accordance with the present invention.

Referring to FIG. 3, a titanium layer 340a is sputtered to deposit across the passivation layer 330 including the exposed surface portions of the copper contact pad 320.

Figure 4:
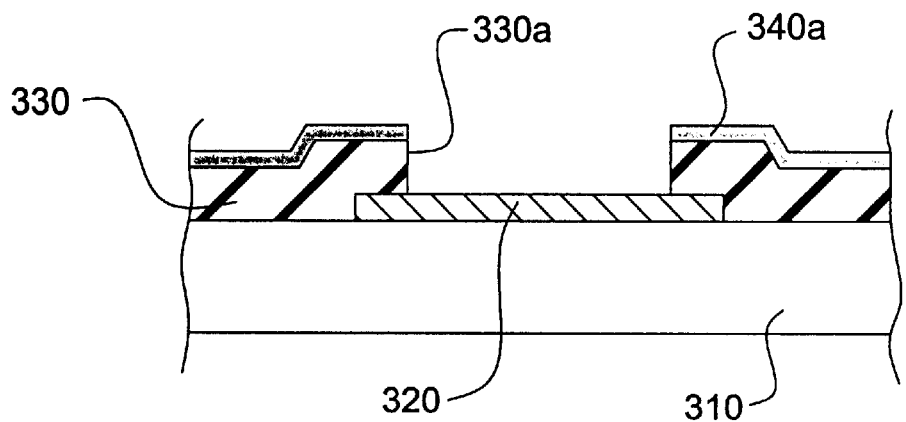

Referring to FIG. 4, the titanium layer 340a is selectively etched to form a titanium opening corresponding to the passivation layer opening 330a.

Figure 5:
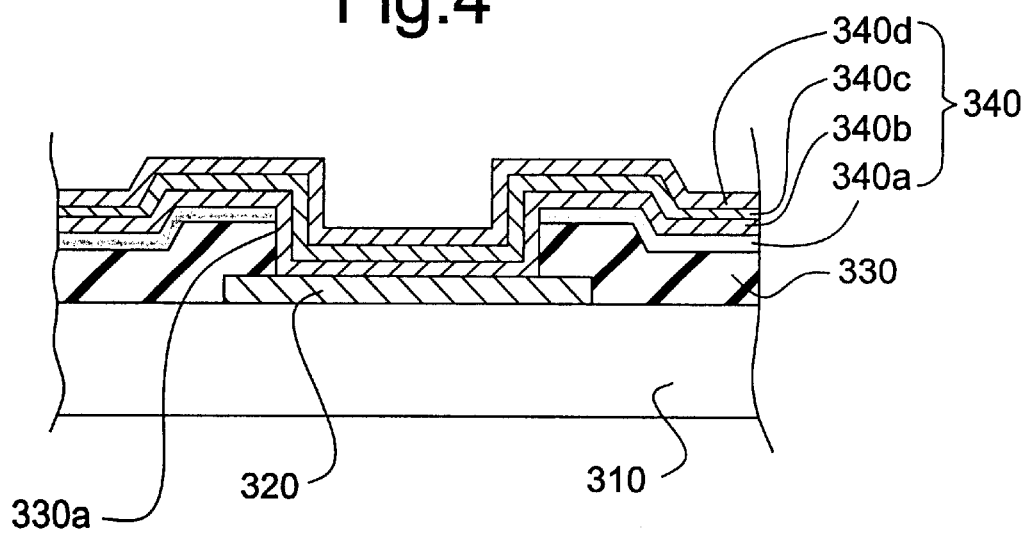

Referring to FIG. 5, other metal layers of the UBM 340 (including the first copper layer 340b, the nickel-vanadium layer 340c and the second copper layer 340d) are sputtered to deposit on the titanium layer 340a and the central surface portion of the copper contact pad 320 exposed from the passivation layer 330 and the titanium layer 340a.

Figure 6:
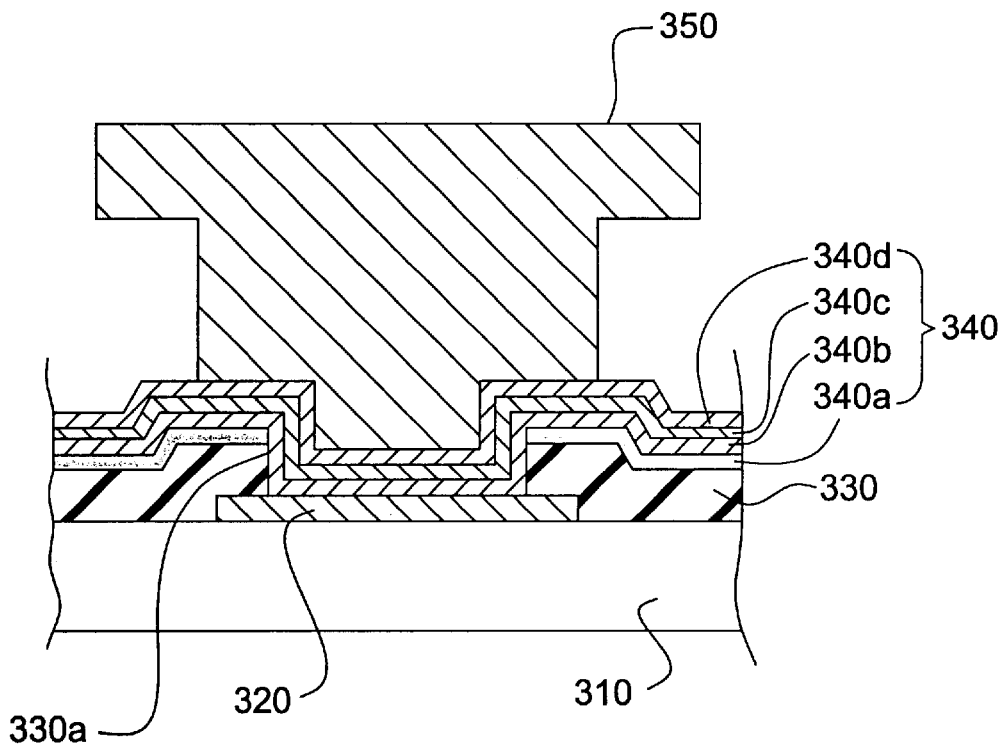

Referring to FIG. 6, after applying a layer of photoresist and patterning the photoresist layer, solder is electrodeposited on the photoresist opening section to obtain the solder bump 350; thereafter, the remaining photoresist is stripped.

Referring to FIG. 7, the UBM layers are etched with the solder bump 350 as a mask, and then a reflow step is proceeded.

Figure 8:
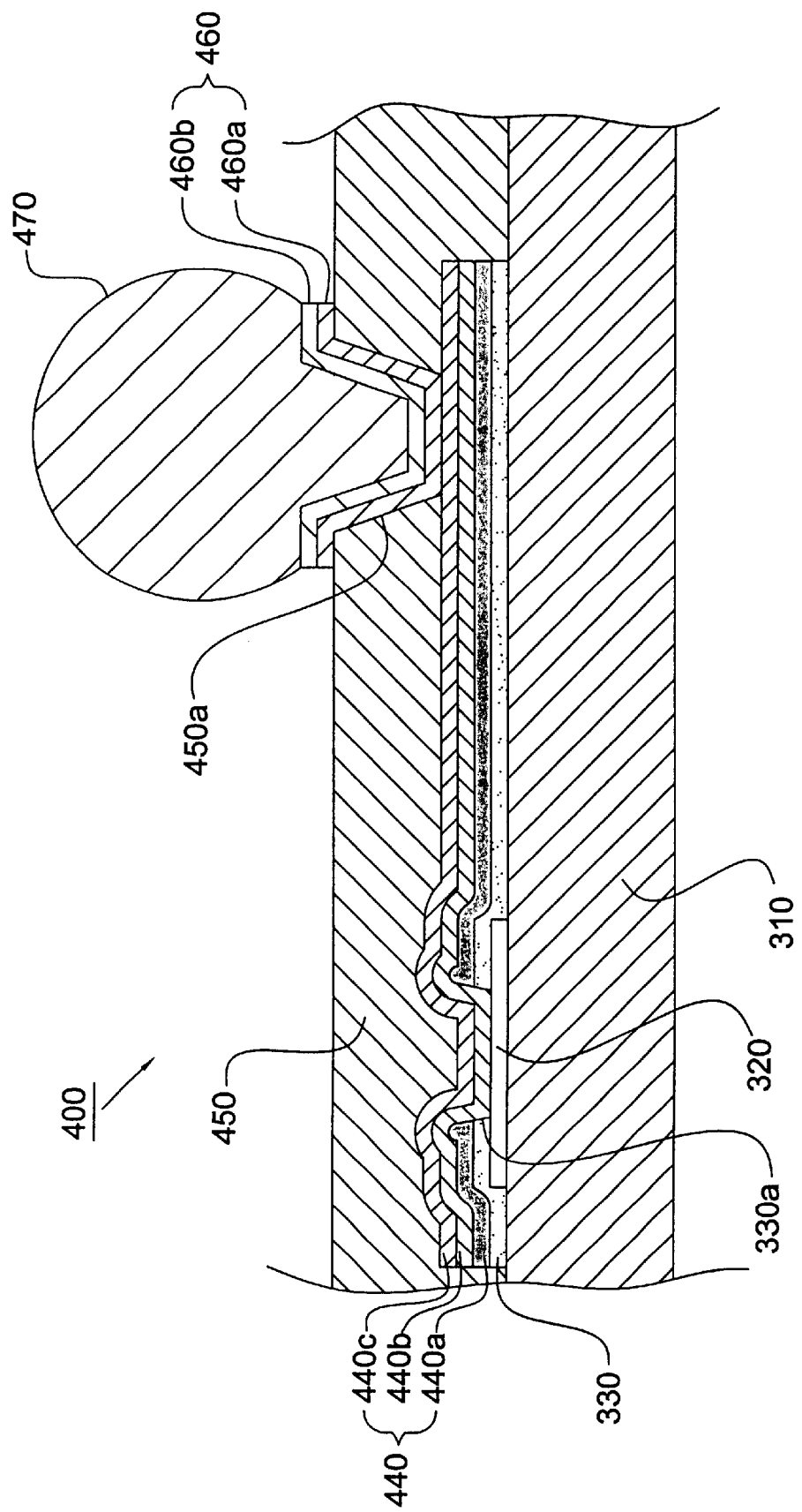
FIG. 8 is a schematic sectional view of a portion of a semiconductor device having a bump electrode in accordance with another preferred embodiment of the present invention.

FIG. 8 shows a portion of a semiconductor device 400 having a bump electrode in accordance with another embodiment of the present invention. The semiconductor device 400 is a package with I/O redistribution implemented at the wafer level. The semiconductor device 400 mainly comprises a multi-layered lead 440 having a first end portion connected to the copper contact pad 320 through the passivation opening 330a and a second end portion extending on the passivation layer 330. The multi-layered lead 440 includes a first titanium layer 440a on the passivation layer 330, a copper layer 440b on the first titanium layer 440a and a second titanium layer 440c on the copper layer 440b. The first titanium layer 440a has a opening corresponding to the passivation opening 330a. The copper layer 440b directly contacts the copper contact pad 320 through the opening of the first titanium layer 440a and the opening 330a thereby providing a better electrical performance. It could be understood that the multi-layered lead 440 is a part of a desired trace pattern to redistribute the copper contact pads 320 into a desired format.

A dielectric layer 450, preferably formed by a polyimide, is formed over the multi-layered lead 440 and the passivation layer 330. The dielectric layer 450 has a photo-defined blind-via 450a formed corresponding to the second end portion (away from the copper contact pad 320) of the multi-layered lead 440. A conductive pad 460 is formed over the blind-via 450a. Preferably, the conductive pad 460 comprises a nickel-vanadium layer 460a formed over the blind-via 450a and a copper layer 460b formed on the nickel-vanadium layer 450a. A solder bump 470 is provided on the copper layer 460b. Alternatively, the solder bump 470 may be replaced with a gold bump.

Although the invention has been explained in relation to its preferred embodiment, it is to be understood that many other possible modifications and variations can be made without departing from the spirit and scope of the invention as hereinafter claimed.

What is claimed is:

1. A semiconductor device having a bump electrode comprising:

a substrate having a copper contact pad;

a dielectric layer formed over the substrate, the dielectric layer having a first opening positioned over the copper contact pad;

a titanium layer on the dielectric layer wherein the titanium layer has a second opening corresponding to the first opening of the dielectric layer;

a first copper layer being formed on the titanium layer and directly contacting the copper contact pad through the first opening of the dielectric layer and the second opening of the titanium layer;

a nickel-vanadium layer formed on the first copper layer;

a second copper layer formed on the nickel-vanadium layer; and a metal bump provided on the second copper layer.

2. The semiconductor device as claimed in claim 1, wherein the dielectric layer is a passivation layer.

3. The semiconductor device as claimed in claim 1, wherein the metal bump is a gold bump.

4. The semiconductor device as claimed in claim 1, wherein the metal bump is a solder bump.

5. A semiconductor device having a bump electrode comprising:

a substrate having a copper contact pad;

a first dielectric layer formed over the substrate, the first dielectric layer having a first opening positioned over the copper contact pad;

a multi-layered lead having a first end portion connected to the copper contact pad through the first opening and a second end portion extending on the first dielectric layer;

the multi-layered lead including a first titanium layer on the first dielectric layer, a copper layer on the first titanium layer and a second titanium layer on the copper layer wherein the first titanium layer has a second opening corresponding to the first opening and the copper layer directly contacts the copper contact pad through the second opening and the first opening;

a second dielectric layer formed over the multi-layered lead and the first dielectric layer, the second dielectric layer having a blind-via formed corresponding to the second end portion of the multi-layered lead;

a conductive pad formed over the blind-via; and a metal bump provided on the conductive pad.

6. The semiconductor device as claimed in claim 5, wherein the first dielectric layer is a passivation layer.

7. The semiconductor device as claimed in claim 5, wherein the conductive pad comprises a nickel-vanadium layer formed over the blind-via and a copper layer formed on the nickel-vanadium layer.

8. The semiconductor device as claimed in claim 5, wherein the metal bump is a gold bump.

9. The semiconductor device as claimed in claim 5, wherein the metal bump is a solder bump.

* * * * *